(12) United States Patent
Chen et al.

(10) Patent No.: US 8,617,322 B2
(45) Date of Patent: Dec. 31, 2013

(54) LAMINATED STRUCTURE BY INTERNAL OXIDATION AND FORMING METHOD THEREOF

(75) Inventors: Yung-I Chen, Taipei (TW); Rong-Tan Huang, Hsinchu County (TW); Bing-Nan Tsai, Changhua County (TW)

(73) Assignee: National Taiwan Ocean University, Keelung (TW)

( * ) Notice: Subject to any disclaimer, the term of this patent is extended or adjusted under 35 U.S.C. 154(b) by 253 days.

(21) Appl. No.: 12/953,461

(22) Filed: Nov. 24, 2010

(65) Prior Publication Data

US 2011/0259477 A1    Oct. 27, 2011

(30) Foreign Application Priority Data

Apr. 22, 2010 (TW) ............................... 99112681 A

(51) Int. Cl.
*C23C 8/10* (2006.01)
*C23C 28/00* (2006.01)

(52) U.S. Cl.
USPC ............ 148/276; 148/277; 148/285; 428/815

(58) Field of Classification Search
USPC .......................... 148/276, 277, 285; 428/815
See application file for complete search history.

(56) References Cited

U.S. PATENT DOCUMENTS 5,259,885 A * 11/1993 Sandhage .................. 505/450
5,538,528 A    7/1996 Kashiwagi et al.

OTHER PUBLICATIONS

Yung-I Chen, "Investigation on the oxidation behavior of Mo-Ru hard coatings," Surface & Coatings Technology 204, Sep. 9, 2009, pp. 860-pp. 864.
Yung-I Chen, Li-Chun Chang, Jyh-Wei Lee, Chih-Hsiung Lin, "Annealing and oxidation study of Mo-Ru hard coatings on tungsten carbide," Thin Solid Films 518, Jul. 12, 2009, pp. 194-pp. 200.
"Office Action of Taiwan Counterpart Application", issued on May 14, 2013, p. 1-p. 7, in which the listed references were cited.

* cited by examiner

*Primary Examiner* — Lois Zheng
(74) *Attorney, Agent, or Firm* — Jianq Chyun IP Office IP Office

(57) ABSTRACT

A laminated structure by internal oxidation includes an alloy coating layer structured as columnar grains. The alloy coating layer includes a first metal element and a second metal element, wherein the first metal element is oxidized more easily than the second metal element. The surface layer portion of the alloy coating layer has a plurality of oxide layers and a plurality of metal layers stacked alternately with each other. The material of the oxide layers includes the oxide of the first metal element and the material of the metal layers includes the second metal element.

5 Claims, 4 Drawing Sheets

LAMINATED STRUCTURE BY INTERNAL OXIDATION AND FORMING METHOD THEREOF

CROSS-REFERENCE TO RELATED APPLICATION

This application claims the priority benefit of Taiwan application serial no. 99112681, filed on Apr. 22, 2010. The entirety of the above-mentioned patent application is hereby incorporated by reference herein and made a part of this specification.

BACKGROUND OF THE INVENTION

1. Field of Invention

The present invention relates to a laminated structure by internal oxidation and a forming method thereof, and more generally to a laminated structure by internal oxidation having oxide layers and metal layers stacked alternately and a forming method thereof.

2. Description of Related Art

Conventionally, the property of a material or a device and the accuracy and reliability of a product or a reproduction are usually achieved by a surface modification technique. For example, in a press-molding glass technique, a protection film is coated on the surface of a mold base material to extend the lifetime of the mold, thereby reducing the cost of the press-molding glass product. At present, a noble metal is widely applied in the press-molding glass industry due to the advantages of high chemical stability, erosion resistance, high mold-releasing property and high-temperature stability, so as to avoid a reaction or an adhesion from occurring between the mold and the glass, provide enough hardness and mechanical strength to maintain the quality of the mold itself, improve the thermal-shock resistance of the mold, and extend the lifetime of the mold.

However, a protection film of noble metal is required to be removed through a fine processing when it is damaged, and another protection film of noble metal is then coated again for the regeneration purpose. The increased cost for the mold regeneration process almost the same with the cost for manufacturing a new mold. Moreover, removing the damaged protection film of noble metal and coating another protection film of noble metal are time-consuming. Accordingly, the efficiency of the mold regeneration is low. Therefore, a film-stripping regeneration is developed. In details, a buffer layer is coated below a surface protection film, and the film-stripping is done by erosion and controlled by the chemical difference between the surface protection film and the buffer layer, so as to remove the damaged surface protection film. Thereafter, another new surface protection film is coated for the regeneration purpose.

Besides, since the noble metal is expensive, a high-temperature alloy such as a Ta-containing alloy disclosed in U.S. Pat. No. 5,538,528 is used instead. A Mo-containing alloy is also usable, but a Mo—Ru alloy film reacts with glass if not under vacuum. Mo is oxidized more easily in an atmosphere containing 10 ppm oxygen, so that the surfaces of upper and lower molds are roughened to cause the glass adhesion. Therefore, it is necessary to develop a protection film with stable oxide.

Moreover, a diamond film is usually coated on the surface of a cemented carbide mold. When a cobalt-containing cemented carbide mold is used, it is required to avoid cobalt from diffusing out, otherwise diamond nucleation is impossible and a graphite is formed. Accordingly, a barrier layer is coated on the surface of the cemented carbide mold to prevent cobalt from diffusing to the nucleation sites of diamond. However, the conventional barrier layer is a single-layer structure with less barrier ability against cobalt diffusion, so that it is unable to effectively block colt from diffusing to the nucleation sites of diamond.

SUMMARY OF THE INVENTION

The present invention provides a laminated structure by internal oxidation having oxide layers and metal layers stacked alternately.

The present invention provides a method to form the above-mentioned laminated structure by internal oxidation.

The present invention provides a laminated structure by internal oxidation including an alloy coating layer. The alloy coating layer has a columnar grain structure and includes a first metal element and a second metal element. The first metal element is oxidized more easily than the second metal element. A surface portion of the alloy coating layer has a plurality of oxide layers and a plurality of metal layers stacked alternately with each other. A material of the oxide layers includes an oxide of the first metal element, and a material of the metal layers includes the second metal element.

According to an embodiment of the present invention, each of the oxide layers and the metal layers is disposed transversely adjacent grains.

According to an embodiment of the present invention, the oxide layers and the metal layers are stacked alternately along a growth direction of the columnar grain structure.

According to an embodiment of the present invention, the first metal element includes Al, Cr, Cd, In, Mo, Sn, Ta, Y or Zr.

According to an embodiment of the present invention, the second metal element includes Ru, Re, Pt, Ir, Os, Pd, Rh, Au or Ag.

According to an embodiment of the present invention, a combination of the first metal element and the second metal element includes Ag—Sn, Ag—In, Ag—Cd, Ag—Y, Pd—Al, Pd—Mo, Pd—Cr, Ir—Al, Ru—Al, Ru—Mo, Ru—Ta, Pt—Zr, Re—Mo or Re—Ta.

The present invention provides a forming method of a laminated structure by internal oxidation. An alloy coating layer is formed. The alloy coating layer has a columnar grain structure and includes a first metal element and a second metal element, and the first metal element is oxidized more easily than the second metal element. Thereafter, a thermal oxidation treatment process is performed to the alloy coating layer, so as to form a plurality of oxide layers and a plurality of metal layers stacked alternately with each other from a surface portion of the alloy coating layer. A material of the oxide layers includes an oxide of the first metal element, and a material of the metal layers includes the second metal element.

According to an embodiment of the present invention, each oxide layer is a transgranular layer.

According to an embodiment of the present invention, the oxide layers and the metal layers stacked alternately along a growth direction of the columnar grain structure.

According to an embodiment of the present invention, the first metal element includes Al, Cr, Cd, In, Mo, Sn, Ta, Y or Zr.

According to an embodiment of the present invention, the second metal element includes Ru, Re, Pt, Ir, Os, Pd, Rh, Au or Ag.

According to an embodiment of the present invention, a combination of the first metal element and the second metal element includes Ag—Sn, Ag—In, Ag—Cd, Ag—Y, Pd—Al, Pd—Mo, Pd—Cr, Ir—Al, Ru—Al, Ru—Mo, Ru—Ta, Pt—Zr, Re—Mo or Re—Ta.

According to an embodiment of the present invention, a method of forming the alloy coating layer includes a sputtering process.

According to an embodiment of the present invention, the method of forming the alloy coating layer includes alternately exposing the substrate to two sources in a co-sputtering process, wherein one of the sources includes the first metal element, and the other of the sources includes the second metal element.

According to an embodiment of the present invention, the alloy coating layer reveals a periodically concentration distribution, in which a first metal element concentration increases while a second metal element concentration decreases, and the first metal element concentration decreases while the second metal element concentration increases.

In view of the above, the laminated structure by internal oxidation of the present invention has oxide layers and metal layers stacked alternately. Therefore, when the laminated structure by internal oxidation is formed on the surface of a mold base material, the oxide layers O serve as protection layers and the metal layers M serve as buffer layers; or the oxide layers O serve as buffer layers and the metal layers M serve as protection layers. In other words, the laminated structure by internal oxidation 100 of this embodiment has protection layers and buffer layers stacked alternately. Therefore, when one or more protection layers are damaged, the buffer layers connected to the damaged protection layers are removed through an etching process to expose the next protection layer. Accordingly, in the present invention, a protection layer can be easily regenerated, so that the conventional fine processing and the time and cost for coating another protection layer of noble metal are not required, and the efficiency of the mold regenerating is enhanced. If required, one or more protection layers (and buffer layers) are selectively removed to ensure the regenerated protection layer undamaged. The method of regenerating a protection layer further includes removing the damaged protection layer to expose the metal layer therebelow, and then oxidizing the exposed metal layer to form a new oxide layer. Alternatively, another thermal oxidation treatment process is preformed, so as to form a laminated structure from a portion of the alloy coating layer not oxidized by the previous thermal oxidation treatment process, thereby achieving the purpose of regenerating protection layers.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
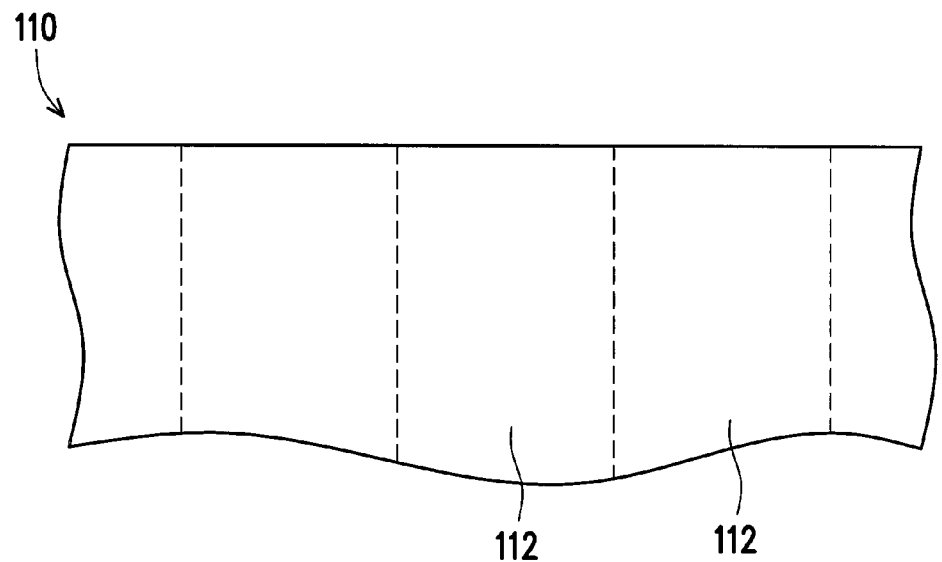
FIGS. 1A to 1B schematically illustrate cross-sectional views of a forming method of a laminated structure by internal oxidation according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
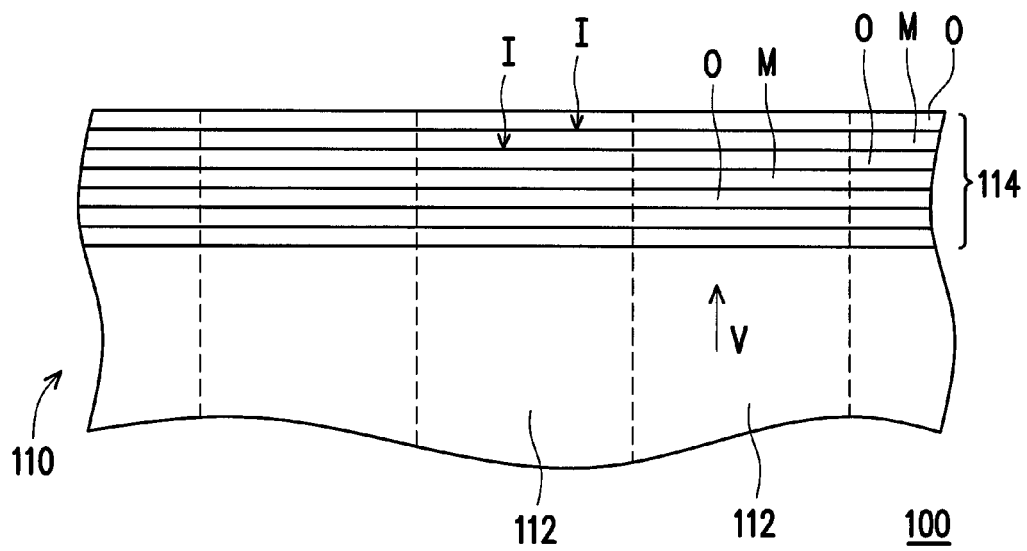
Figure 1C:
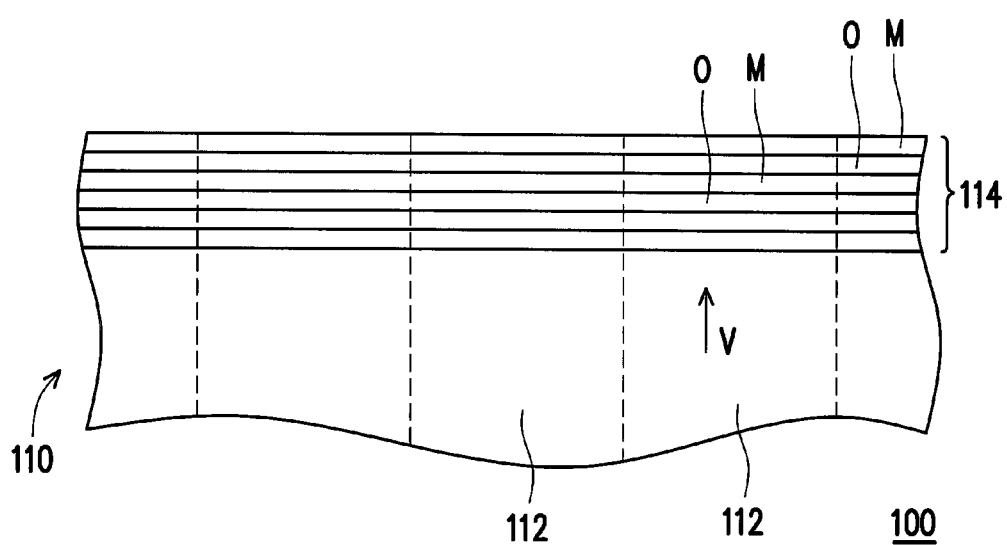
FIG. 1C schematically illustrates a cross-sectional view of a laminated structure by internal oxidation according to an embodiment of the present invention.

FIGS. 1A to 1B schematically illustrate cross-sectional views of a forming method of a laminated structure by internal oxidation according to an embodiment of the present invention. FIG. 1C schematically illustrates a cross-sectional view of a laminated structure by internal oxidation according to an embodiment of the present invention.

Referring to FIG. 1A, an alloy coating layer 110 is formed through a sputtering process, for example. The alloy coating layer 110 has a columnar grain structure constituted by a plurality of columnar grains 112, and the columnar grains 112 have excellent directional alignment. The alloy coating layer 110 includes a first metal element and a second metal element, wherein the first metal element is oxidized more easily than the second metal element. In this embodiment, the first metal element includes Al, Cr, Cd, In, Mo, Sn, Ta, Y or Zr. In this embodiment, the second metal element includes Ru, Re, Pt, Ir, Os, Pd, Rh, Au, Ag or a suitable noble metal element. The combination of the first metal element and the second metal element includes Ag—Sn, Ag—In, Ag—Cd, Ag—Y, Pd—Al, Pd—Mo, Pd—Cr, Ir—Al, Ru—Al, Ru—Mo, Ru—Ta, Pt—Zr, Re—Mo or Re—Ta. The present invention discloses the examples of the first metal element and the second metal element and the possible combinations. However, the scope of the claims is not limited thereto. Persons skilled in the art should appreciate that, without departing from the spirit and scope of the present invention, other metal elements belong to the present invention as long as the combination includes a first metal element liable to oxidation and a second metal element not liable to oxidation.

Referring to FIG. 1B, a thermal oxidation treatment process is performed to the alloy coating layer 110, so as to form a plurality of oxide layers O and a plurality of metal layers M stacked alternately with each other from a surface portion 114 of the alloy coating layer 110. The laminated structure by internal oxidation 100 of this embodiment is thus completed.

The outmost layer of the laminated structure by internal oxidation 100 can be an oxide layer O or a metal layer M. For example, in FIG. 1B, the outmost layer of the laminated structure by internal oxidation 100 is an oxide layer O, but the present invention is not limited thereto.

The material of the oxide layers O includes the oxide of the first metal element, and the material of the metal layers M includes the second metal element. Each of the oxide layers O and the metal layers M is a transgranular layer, for example. That is, the oxide layers O are formed transversely the adjacent grains and not formed in a single grain or separate grains. Similarly, the metal layers M are formed transversely the adjacent grains and not formed in a single grain or separate grains. In this embodiment, the oxide layers O and the metal layers M are stacked alternately along a growth direction V of the columnar grain structure.

It is noted that the laminated structure by internal oxidation 100 of this embodiment has oxide layers O and the metal layers M stacked alternately, and thus, when the laminated structure by internal oxidation 100 is formed on the surface of a mold base material, the oxide layers O serve as protection layers and the metal layers M serve as buffer layers; or the oxide layers O serve as buffer layers and the metal layers M serve as protection layers. In other words, the laminated structure by internal oxidation 100 of this embodiment has protection layers and buffer layers stacked alternately. Therefore, when one or more protection layers are damaged, the buffer layers connected to the damaged protection layers are removed through an etching process to expose the next protection layer.

Specifically, when the laminated structure by internal oxidation 100 is formed on the surface of the mold base material, the outmost oxide layer O is removed to expose the outmost metal layer M (as shown in FIG. 1C). The outmost metal layer M serves as a protection layer and the oxide layer O connected thereto serves as a buffer layer. Accordingly, when the outmost metal layer M is damaged, the oxide layer O connected thereto is removed through a selectively etching process by using the chemical difference between the oxide layers O and the metal layers M, and thus, the outmost metal layer M is removed to expose the next metal layer M.

Consequently, in this embodiment, a protection layer can be easily regenerated, so that the conventional fine processing and the time and cost for coating another protection layer of noble metal are not required, and the efficiency of regenerating a protection layer is enhanced. If required, one or more protection layers (and buffer layers) are selectively removed to ensure the regenerated protection layer undamaged.

In addition, when multiple metal layers M are damaged, the oxide layers O between the damaged metal layers M and the oxide layers O connected to the damaged metal layers M are removed through a selectively etching process by using the chemical difference between the oxide layers O and the metal layers M, and thus, the damaged metal layers M are removed to expose the next intact metal layer M (i.e. undamaged metal layer M).

Besides, in another embodiment, the outmost oxide layer O can serve as a protection layer and the metal layer M connected thereto can serve as a buffer layer. Accordingly, when the outmost oxide layer O is damaged, the metal layer M connected thereto is removed through a selectively etching process by using the chemical difference between the oxide layers O and the metal layers M, and thus, the outmost oxide layer O is removed to expose the next oxide layer O.

Also, when multiple oxide layers O are damaged, the metal layers M between the damaged oxide layers O and the metal layers M connected to the damaged oxide layers O are removed through a selectively etching process by using the chemical difference between the oxide layers O and the metal layers M, and thus, the damaged oxide layers O are removed to expose the next intact oxide layer O (i.e. undamaged oxide layer O).

In another embodiment, the oxide layers O can serve as protection layers. When the outmost oxide layer O is damaged, it is removed to expose the metal layer M therebelow. Thereafter, an oxidation process is performed to the exposed metal layer M to form a new oxide layer thereon serving as a regenerated protection layer.

Besides, in this embodiment, another thermal oxidation treatment process can be optionally preformed, so as to form a laminated structure (i.e. oxide layers O and metal layers M stacked alternately) from a portion of the alloy coating layer 110 not oxidized by the previous thermal oxidation treatment process, thereby achieving the purpose of regenerating protection layers.

Moreover, in this embodiment, the oxide layers O of the laminated structure by internal oxidation 100 can serve as diffusion barrier layers. For example, before a diamond film is coated on the surface of a cemented carbide mold, the laminated structure by internal oxidation 100 of this embodiment can be coated on the surface of the cemented carbide mold, so as to block cobalt from diffusion to the nucleation sites of diamond. Accordingly, when cobalt is diffused to the nucleation sites of diamond, it has to pass a plurality of interfaces I between the oxide layers O and the metal layers M. In this manner, the diffusion rate of cobalt in the laminated structure by internal oxidation 100 is lower than that in the conventional single barrier layer, so that the cobalt diffusion can not occur easily in the laminated structure by internal oxidation 100. Therefore, the laminated structure by internal oxidation 100 has multiple layers stacked alternately, so as to provide better barrier ability against the cobalt diffusion. However, the present invention is not limited thereto. The laminated structure by internal oxidation 100 of this embodiment also provides better barrier ability against other elements, compounds or materials.

Besides, the oxide layers O (or the metal layers M) can be selectively removed by using the chemical difference between the oxide layers O and the metal layers M, so as to form a laminated structure constituted by the metal layers M (or the oxide layers O).

Moreover, the oxide layers O in the laminated structure by internal oxidation 100 can serve as dielectric layers.

It is noted that the described applications of the laminated structure by internal oxidation 100 are provided only for illustration purposes, and are not construed as limiting the present invention.

Some samples formed by the method of the present invention are introduced in different examples as follows.

Figure 2:
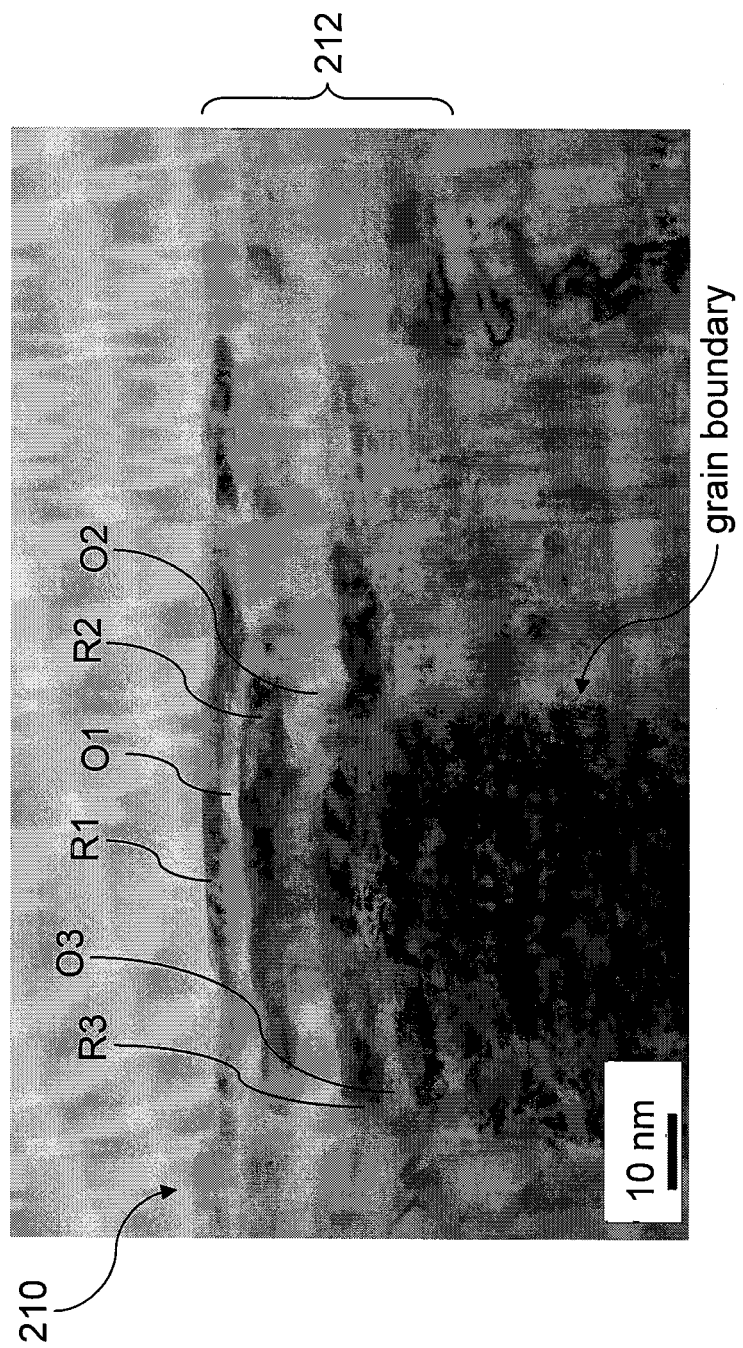
FIGS. 2 and 3 are cross-sectional TEM images of samples of laminated structures by internal oxidation according to two examples of the present invention.
Figure 3:
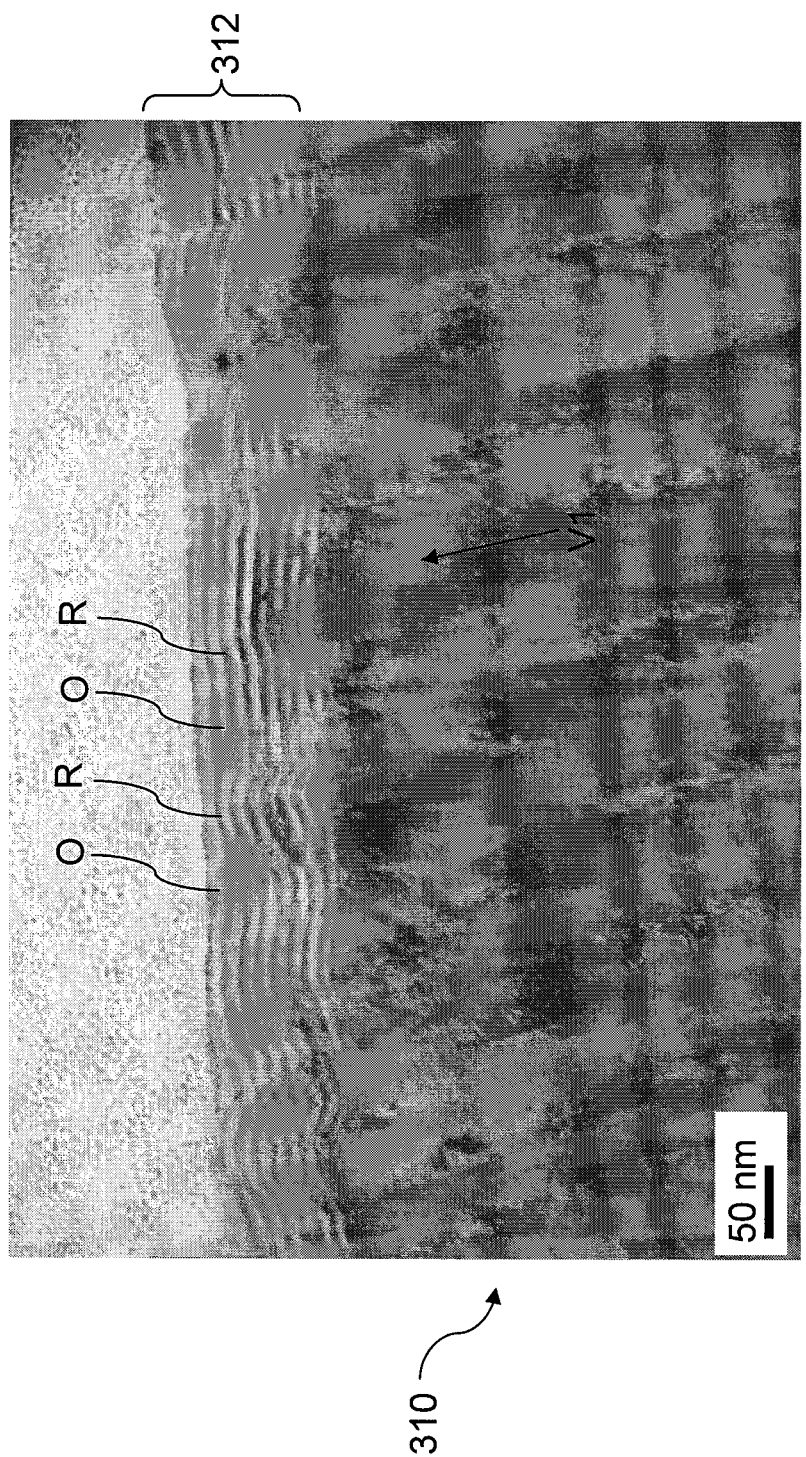

FIGS. 2 and 3 are cross-sectional TEM images of samples of laminated structures by internal oxidation according to two examples of the present invention.

EXAMPLE 1

Referring to FIG. 2, a Mo—Ru coating layer 210 is sputtered on the surface of a silicon wafer. The Mo—Ru coating layer 210 has a columnar grain structure. Thereafter, the Mo—Ru coating layer 210 is placed in an atmosphere containing 220 ppm oxygen (others are nitrogen gas) and heated at 600° C. for 2 hours, so as to form oxide layers O1, O2, O3 and metal layers R1, R2, R3 stacked alternately from a surface portion 212 of the Mo—Ru coating layer 210. The material of the oxide layers O1, O2 and O3 includes an oxide of Mo, and the material of the metal layers R1, R2 and R3 includes Ru.

In FIG. 2, the grain boundaries in the Mo—Ru coating layer 110 are substantially arranged in a vertical direction. The oxide layers O1, O2, O3 and the metal layers R1, R2, R3 are substantially disposed in different horizontal planes.

EXAMPLE 2

Referring to FIG. 3, a Cr buffer layer and a Ta—Ru coating layer 310 are sequentially sputtered on the surface of a silicon substrate. The Ta—Ru coating layer 310 has a columnar grain structure. The method of forming the Ta—Ru coating layer 310 includes alternately exposing the silicon substrate to two sources in a co-sputtering process, wherein one of the sources includes Ta, and the other of the sources includes Ru. The Ta—Ru coating layer 310 reveals a periodically concentration distribution, in which a Ta concentration increases while a Ru concentration decreases, and the Ta concentration decreases while the Ru concentration increases. Specifically, the concentration is varied in a cycle from Ta-rich to Ru-rich and back to Ta-rich.

Thereafter, the Ta—Ru coating layer 310 is placed at a vacuum degree of 3 Pa and heated at 600° C. for 4 hours, so as to form oxide layers O and metal layers R stacked alternately from a surface portion 312 of the Ta—Ru coating layer 310. The material of the oxide layers O includes an oxide of Ta, and the material of the metal layers R includes Ru.

FIG. 3 shows the cross-sectional bright field TEM image of the surface oxidized Ta—Ru coating layer deposited on the silicon substrate. In FIG. 3, the columnar grains in the columnar grain structure are grown along a direction V1, and the grain boundaries are substantially extended along the direction V1. The Ta—Ru columnar grain boundaries are evident in FIG. 3. The laminated structure (i.e. oxide layers O and metal layers R stacked alternately) with a thickness of 88 nm exhibits alternated bright and dark layers. Each layer is continuous except at some grain boundaries. The period of the laminated structure is 11 nm.

In this embodiment, since the substrate holder rotates the silicon substrate at a speed of 5.0 rpm and the sputtering time is 16.5 min, 82.5 rotations are done during the sputtering process. Therefore, the Ta—Ru coating layer 310 has a coating thickness of 702 nm, and the period thereof should be 8.5 nm. As shown in FIG. 3, the period of the periodically concentration distribution is calculated to be around 7.3 nm, similar to the ideal value of 8.5 nm. After introducing oxygen in the Ta—Ru coating layer 310, the period of the oxide/metal laminated structure increases to 11 nm.

EXAMPLE 3

The Mo—Ru alloy coating layer and the Ta—Ru alloy coating layer are place in an atmosphere at 600° C., and different oxygen partial pressures are applied to the Mo—Ru alloy coating layer and the Ta—Ru alloy coating layer. The main oxidation types of the Mo—Ru alloy coating layer and the Ta—Ru alloy coating layer are listed in Table 1.

TABLE 1

| Oxygen partial pressure | Mo—Ru alloy coating layer | Ta—Ru alloy coating layer |
| --- | --- | --- |
| 10 ppm | External oxidation | |
| 50 ppm | External oxidation | Internal oxidation |
| 220 ppm | Internal oxidation | Internal oxidation |
| 1000 ppm | Internal oxidation | Internal oxidation |
| Atmosphere | Internal oxidation | Internal oxidation |

In Table 1, the internal oxidation indicates that oxides are formed from the interior of the alloy, while the external oxidation indicates that oxides are formed on the exterior of the alloy. As shown in Table 1, the internal oxidations of the Mo—Ru alloy coating layer and the Ta—Ru alloy coating layer occur at different ranges of oxygen partial pressure.

In summary, the laminated structure by internal oxidation of the present invention has oxide layers and metal layers stacked alternately. Therefore, when the laminated structure by internal oxidation is formed on the surface of a mold base material, the oxide layers O serve as protection layers and the metal layers M serve as buffer layers; or the oxide layers O serve as buffer layers and the metal layers M serve as protection layers. In other words, the laminated structure by internal oxidation 100 of this embodiment has protection layers and buffer layers stacked alternately. Therefore, when one or more protection layers are damaged, the buffer layers connected to the damaged protection layers are removed through an etching process to expose the next protection layer. Accordingly, in the present invention, a protection layer can be easily regenerated, so that the conventional fine processing and the time and cost for coating another protection layer of noble metal are not required, and the efficiency of regenerating a protection layer is enhanced. If required, one or more protection layers (and buffer layers) are selectively removed to ensure the regenerated protection layer undamaged. The method of regenerating a protection layer further includes removing the damaged protection layer to expose the metal layer therebelow, and then oxidizing the exposed metal layer to form a new oxide layer. Alternatively, another thermal oxidation treatment process is preformed, so as to form a laminated structure from a portion of the alloy coating layer not oxidized by the previous thermal oxidation treatment process, thereby achieving the purpose of regenerating protection layers.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A laminated structure by internal oxidation, comprising:
an alloy coating layer, having a columnar grain structure and comprising a first metal element and a second metal element, wherein the first metal element is oxidized more easily than the second metal element, a surface portion of the alloy coating layer has a plurality of oxide layers and a plurality of metal layers stacked alternately with each other along a growth direction of the columnar grain structure, a material of the oxide layers comprises an oxide of the first metal element, and a material of the metal layers comprises the second metal element.

2. The laminated structure by internal oxidation of claim 1, wherein each of the oxide layers and the metal layers is disposed transversely adjacent grains.

3. The laminated structure by internal oxidation of claim 1, wherein the first metal element comprises Al, Cr, Cd, In, Mo, Sn, Ta, Y or Zr.

4. The laminated structure by internal oxidation of claim 1, wherein the second metal element comprises Ru, Re, Pt, Ir, Os, Pd, Rh, Au or Ag.

5. The laminated structure by internal oxidation of claim 1, wherein a combination of the first metal element and the second metal element comprises Ag-Sn, Ag-In, Ag-Cd, Ag-Y, Pd-Al, Pd-Mo, Pd-Cr, Ir-Al, Ru-Al, Ru-Mo, Ru-Ta, Pt-Zr, Re-Mo or Re-Ta.

* * * * *